(12) United States Patent
Lee et al.

(10) Patent No.: US 11,783,985 B2
(45) Date of Patent: Oct. 10, 2023

(54) CABLE TELEVISION APPARATUS WITH IMPROVED CHOKE

(71) Applicant: CABLE VISION ELECTRONICS CO., LTD, New Taipei (TW)

(72) Inventors: Chien-Chung Lee, New Taipei (TW); I-Sheng Ting, New Taipei (TW); Min-Chi Tseng, New Taipei (TW); Mao-Peng Yu, New Taipei (TW)

(73) Assignee: CABLE VISION ELECTRONICS CO., LTD, New Taipei (TW)

( * ) Notice: Subject to any disclaimer, the term of this patent is extended or adjusted under 35 U.S.C. 154(b) by 742 days.

(21) Appl. No.: 16/600,534

(22) Filed: Oct. 13, 2019

(65) Prior Publication Data

US 2021/0020345 A1    Jan. 21, 2021

(30) Foreign Application Priority Data

Jul. 15, 2019 (TW) .................. 108209199

(51) Int. Cl.
| | | |
|---|---|---|
| *H01F 17/04* | (2006.01) | |
| *H01F 27/30* | (2006.01) | |
| *H04N 5/00* | (2011.01) | |
| *H04N 7/10* | (2006.01) | |
| *H04N 7/04* | (2006.01) | |

(Continued)

(52) U.S. Cl.
CPC ........... *H01F 17/045* (2013.01); *H01B 11/18* (2013.01); *H01F 27/30* (2013.01); *H03H 7/0115* (2013.01); *H04N 5/00* (2013.01); *H04N 7/04* (2013.01); *H04N 7/10* (2013.01)

(58) Field of Classification Search
CPC .......... H01F 17/045; H01F 27/30; H01F 3/14; H01F 2017/065; H01F 17/062; H01F 7/20; H01B 11/18; H03H 7/0115; H03H 5/12; H04N 5/00; H04N 7/04; H04N 7/10; H04N 7/102; H04N 5/3577; H04N 5/379; H04N 17/002; G12B 17/02; G01R 15/202

See application file for complete search history.

(56) References Cited

U.S. PATENT DOCUMENTS 6,901,605 B1 * 5/2005 Sugiura .............. H04N 7/17354
                                                    348/E7.075
2001/0050605 A1 * 12/2001 Sugiura ................. H01F 17/062
                                                    336/92

(Continued)

*Primary Examiner* — Michael E Teitelbaum
(74) *Attorney, Agent, or Firm* — Chun-Ming Shih; HDLS IPR SERVICES

(57) ABSTRACT

A cable television apparatus is applied to an input coaxial cable and an output coaxial cable to transmit a cable television signal. The cable television apparatus includes an improved choke, an input side, an output side, an input capacitor and an output capacitor. The improved choke is electrically connected to the input coaxial cable, the output coaxial cable, the input side, the output side, the input capacitor and the output capacitor. The improved choke includes a conductive wire and a ferrite core. One side of the conductive wire is electrically connected to the input side and one side of the input capacitor. The other side of the conductive wire is electrically connected to the output side and one side of the output capacitor. The ferrite core covers one part of the conductive wire. Moreover, the ferrite core is a high saturation current ferrite core.

10 Claims, 3 Drawing Sheets

(51) Int. Cl.
*H01B 11/18* (2006.01)
*H03H 7/01* (2006.01)

(56) References Cited

U.S. PATENT DOCUMENTS

2011/0121935 A1* 5/2011 Chu .................... H01F 41/0246
29/606
2018/0083334 A1* 3/2018 Petrovic .................... H01P 3/08

* cited by examiner

CABLE TELEVISION APPARATUS WITH IMPROVED CHOKE

BACKGROUND OF THE INVENTION

Field of the Invention

The present invention relates to a cable television apparatus, and especially relates to a cable television apparatus with an improved choke.

Description of the Related Art

Currently, the cable television system is very popular. The cable television system transmits television programs and network signals to client sides through coaxial cables.

The related art cable television system needs to use the related art choke. The related art choke needs the winding, wherein the length of the winding is long. Therefore, the related art choke easily generates parasitic capacitances and parasitic inductances; the (undesired) resonance is generated easily at the high frequency, so that the high frequency characteristics are not good, especially the frequency band above 2 GHz.

SUMMARY OF THE INVENTION

In order to solve the above-mentioned problems, an object of the present invention is to provide a cable television apparatus with an improved choke.

In order to achieve the object of the present invention mentioned above, the cable television apparatus of the present invention is applied to an input coaxial cable and an output coaxial cable to transmit a cable television signal. The cable television apparatus comprises the improved choke, an input side, an output side, an input capacitor and an output capacitor. The improved choke is electrically connected to the input coaxial cable and the output coaxial cable. The input side is electrically connected to one side of the improved choke and the input coaxial cable. The output side is electrically connected to the other side of the improved choke and the output coaxial cable. One side of the input capacitor is electrically connected to one side of the improved choke and the input side. One side of the output capacitor is electrically connected to the other side of the improved choke and the output side. Moreover, the improved choke comprises a conductive wire and a ferrite core. One side of the conductive wire is electrically connected to the input side and one side of the input capacitor. The other side of the conductive wire is electrically connected to the output side and one side of the output capacitor. The ferrite core covers one part of the conductive wire. Moreover, the ferrite core is a high saturation current ferrite core.

Moreover, in an embodiment of the cable television apparatus of the present invention mentioned above, the ferrite core defines a gap to achieve the high saturation current ferrite core.

Moreover, in an embodiment of the cable television apparatus of the present invention mentioned above, a width of the gap can be, for example but not limited to, between 0.1 millimeter and 1.0 millimeter.

Moreover, in an embodiment of the cable television apparatus of the present invention mentioned above, a bearable current of the conductive wire can be, for example but not limited to, greater than or equal to 10 amperes. When the bearable current of the conductive wire is greater than or equal to 10 amperes, the ferrite core still does not saturate (namely, the ferrite core is in a non-saturation status).

Moreover, in an embodiment of the cable television apparatus of the present invention mentioned above, the ferrite core can be, for example but not limited to, made of manganese zinc. The conductive wire can be, for example but not limited to, a copper wire.

Moreover, in an embodiment of the cable television apparatus of the present invention mentioned above, the improved choke further comprises an insulating sleeve covering one part of the conductive wire. Moreover, the ferrite core covers one part of the insulating sleeve. The conductive wire and the insulating sleeve are through the ferrite core. The insulating sleeve is arranged between the conductive wire and the ferrite core, so that the conductive wire is insulated from the ferrite core.

Moreover, in an embodiment of the cable television apparatus of the present invention mentioned above, the insulating sleeve can be, for example but not limited to, made of plastics.

Moreover, in an embodiment of the cable television apparatus of the present invention mentioned above, the cable television apparatus further comprises a directional coupler electrically connected to the other side of the input capacitor and the other side of the output capacitor.

Moreover, in an embodiment of the cable television apparatus of the present invention mentioned above, the cable television apparatus further comprises a transformer and a distribution circuit. The transformer is electrically connected to the directional coupler. The distribution circuit is electrically connected to the transformer.

Moreover, in an embodiment of the cable television apparatus of the present invention mentioned above, the ferrite core can be, for example but not limited to, a cylinder. A height of the cylinder can be, for example but not limited to, 12 millimeters. A first diameter of the cylinder can be, for example but not limited to, 11 millimeters. The cylinder defines a center through hole. The conductive wire and the insulating sleeve are through the center through hole. A second diameter of the center through hole can be, for example but not limited to, 2.7 millimeters. A width of the gap can be, for example but not limited to, 0.2 millimeter.

The advantage of the present invention is to reduce parasitic capacitances and parasitic inductances of the choke used in the cable television apparatus to improve high frequency characteristics of the choke, and to save the cost of the winding of the choke used in the cable television apparatus.

Please refer to the detailed descriptions and figures of the present invention mentioned below for further understanding the technology, method and effect of the present invention achieving the predetermined purposes. It believes that the purposes, characteristic and features of the present invention can be understood deeply and specifically. However, the figures are only for references and descriptions, but the present invention is not limited by the figures.

DETAILED DESCRIPTION OF THE INVENTION

Figure 1:
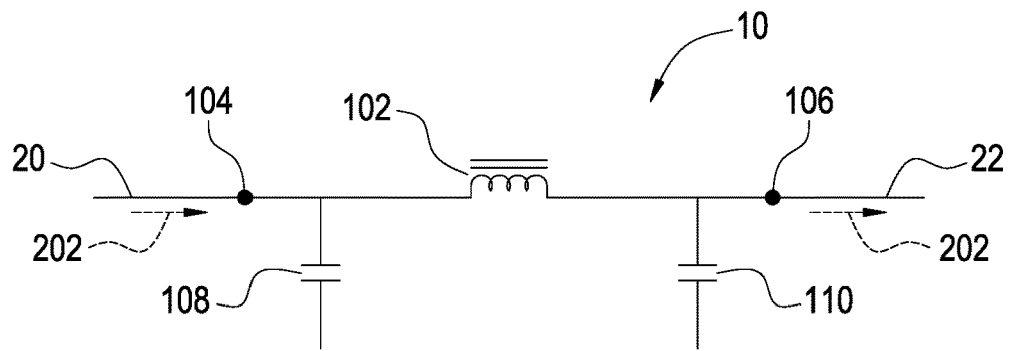
FIG. 1 shows the first embodiment of the cable television apparatus of the present invention.

In the present disclosure, numerous specific details are provided, to provide a thorough understanding of embodiments of the invention. Persons of ordinary skill in the art will recognize, however, that the present invention can be practiced without one or more of the specific details. In other instances, well-known details are not shown or described to avoid obscuring aspects of the present invention. Now please refer to the figures for the explanation of the technical content and the detailed description of the present invention:

FIG. 1 shows the first embodiment of the cable television apparatus of the present invention. A cable television apparatus 10 of the present invention is applied to an input coaxial cable 20 and an output coaxial cable 22 to transmit a cable television signal 202. The cable television apparatus 10 comprises an improved choke 102, an input side 104, an output side 106, an input capacitor 108 and an output capacitor 110. The improved choke 102 is electrically connected to the input coaxial cable 20 and the output coaxial cable 22. The input side 104 is electrically connected to one side of the improved choke 102 and the input coaxial cable 20. The output side 106 is electrically connected to the other side of the improved choke 102 and the output coaxial cable 22. One side of the input capacitor 108 is electrically connected to one side of the improved choke 102 and the input side 104. One side of the output capacitor 110 is electrically connected to the other side of the improved choke 102 and the output side 106.

Figure 2:
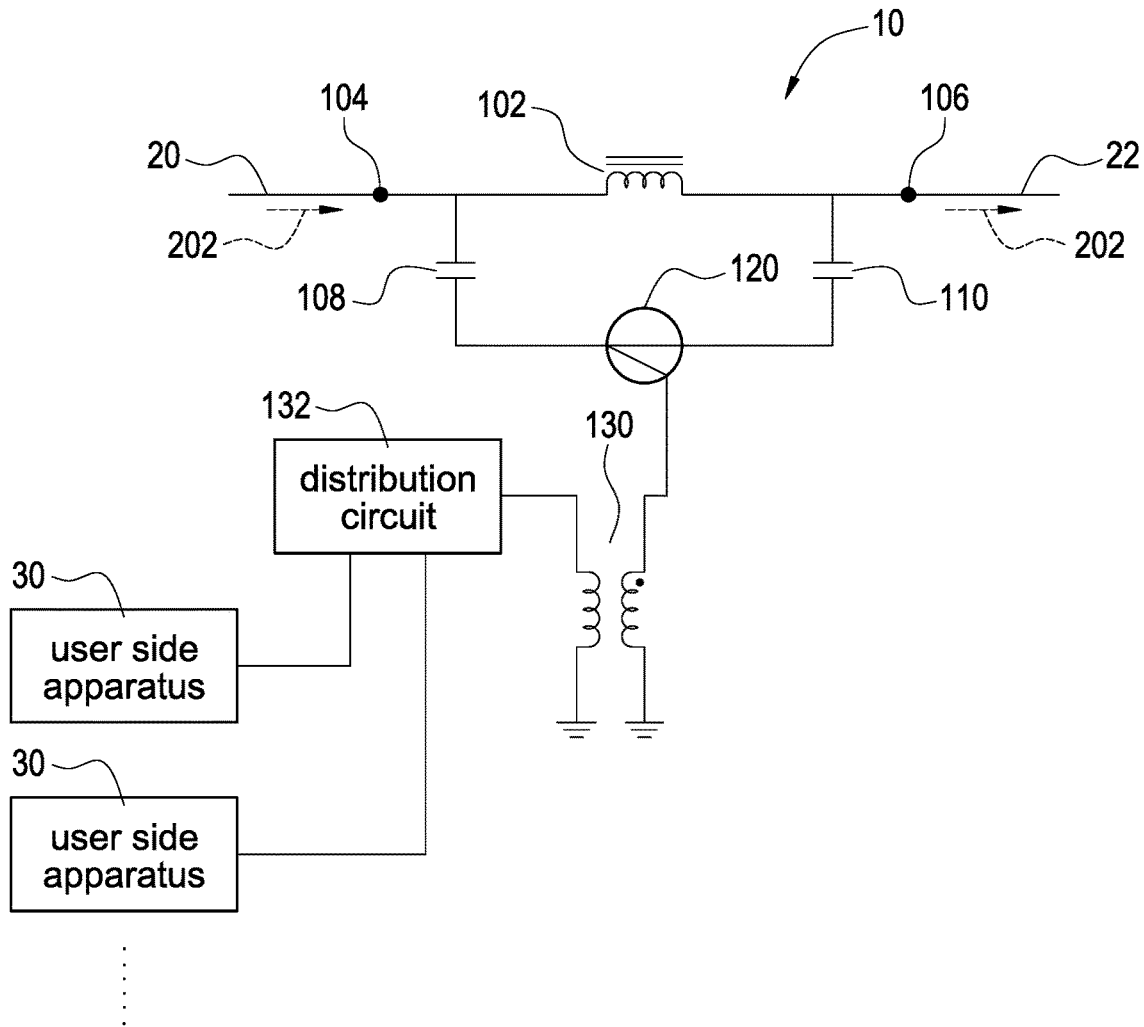
FIG. 2 shows the second embodiment of the cable television apparatus of the present invention.

FIG. 2 shows the second embodiment of the cable television apparatus of the present invention. A cable television apparatus 10 of the present invention is applied to an input coaxial cable 20, an output coaxial cable 22 and a plurality of user side apparatuses 30 to transmit a cable television signal 202. The cable television apparatus 10 comprises an improved choke 102, an input side 104, an output side 106, an input capacitor 108, an output capacitor 110, a directional coupler 120, a transformer 130 and a distribution circuit 132. The improved choke 102 is electrically connected to the input coaxial cable 20 and the output coaxial cable 22. The input side 104 is electrically connected to one side of the improved choke 102 and the input coaxial cable 20. The output side 106 is electrically connected to the other side of the improved choke 102 and the output coaxial cable 22. One side of the input capacitor 108 is electrically connected to one side of the improved choke 102 and the input side 104. One side of the output capacitor 110 is electrically connected to the other side of the improved choke 102 and the output side 106. The directional coupler 120 is electrically connected to the other side of the input capacitor 108 and the other side of the output capacitor 110. The transformer 130 is electrically connected to the directional coupler 120. The distribution circuit 132 is electrically connected to the transformer 130.

Figure 3:
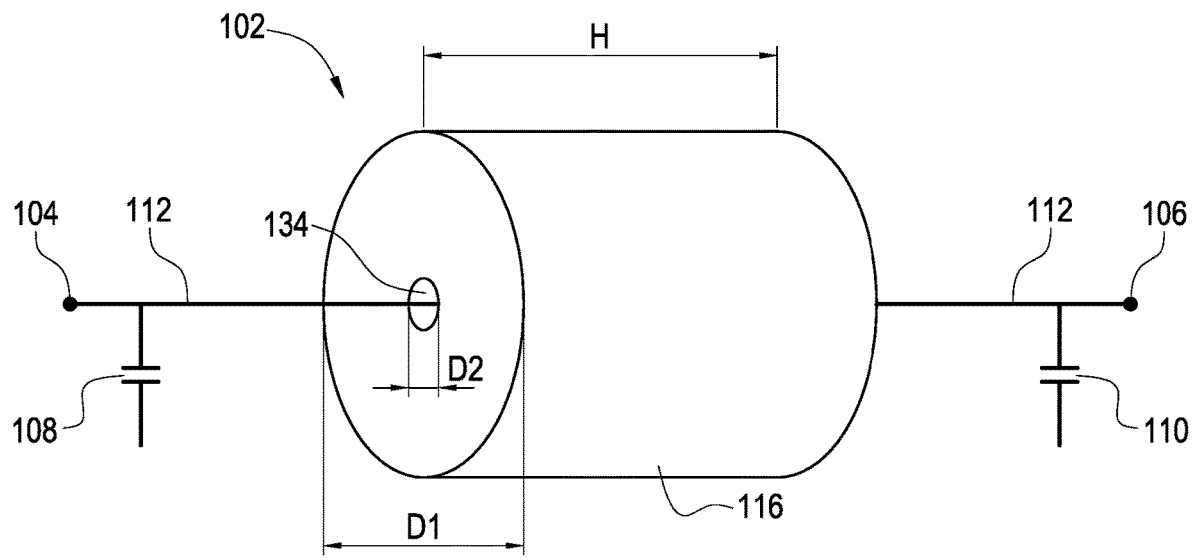
FIG. 3 shows the first embodiment of the improved choke of the present invention.

FIG. 3 shows the first embodiment of the improved choke of the present invention. The improved choke 102 comprises a conductive wire 112 and a ferrite core 116. One side of the conductive wire 112 is electrically connected to the input side 104 and one side of the input capacitor 108. The other side of the conductive wire 112 is electrically connected to the output side 106 and one side of the output capacitor 110. The ferrite core 116 covers one part of the conductive wire 112. The conductive wire 112 is through the ferrite core 116. The ferrite core 116 can be, for example but not limited to, a high saturation current ferrite core. A bearable current of the conductive wire 112 can be, for example but not limited to, greater than or equal to 10 amperes. When the bearable current of the conductive wire 112 is greater than or equal to 10 amperes, the ferrite core 116 still does not saturate (namely, the ferrite core 116 is in a non-saturation status). The ferrite core 116 can be, for example but not limited to, made of manganese zinc. The conductive wire 112 can be, for example but not limited to, a copper wire. The ferrite core 116 can be, for example but not limited to, a cylinder. A height H of the cylinder can be, for example but not limited to, 12 millimeters. A first diameter D1 of the cylinder can be, for example but not limited to, 11 millimeters. The cylinder defines a center through hole 134. The conductive wire 112 is through the center through hole 134. A second diameter D2 of the center through hole 134 can be, for example but not limited to, 2.7 millimeters.

Figure 4:
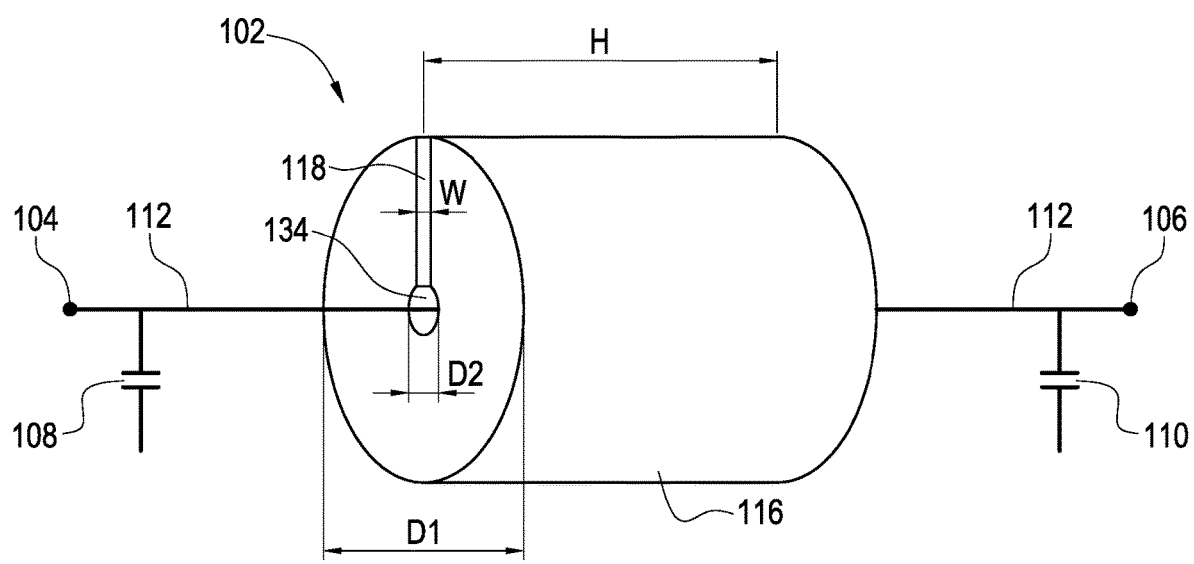
FIG. 4 shows the second embodiment of the improved choke of the present invention.

FIG. 4 shows the second embodiment of the improved choke of the present invention. The improved choke 102 comprises a conductive wire 112 and a ferrite core 116. One side of the conductive wire 112 is electrically connected to the input side 104 and one side of the input capacitor 108. The other side of the conductive wire 112 is electrically connected to the output side 106 and one side of the output capacitor 110. The ferrite core 116 covers one part of the conductive wire 112. The conductive wire 112 is through the ferrite core 116. The ferrite core 116 can be, for example but not limited to, a high saturation current ferrite core. The ferrite core 116 defines a gap 118 to achieve the high saturation current ferrite core. A width W of the gap 118 can be, for example but not limited to, between 0.1 millimeter and 1.0 millimeter, for example, 0.2 millimeter. A bearable current of the conductive wire 112 can be, for example but not limited to, greater than or equal to 10 amperes. When the bearable current of the conductive wire 112 is greater than or equal to 10 amperes, the ferrite core 116 still does not saturate (namely, the ferrite core 116 is in a non-saturation status). The ferrite core 116 can be, for example but not limited to, made of manganese zinc. The conductive wire 112 can be, for example but not limited to, a copper wire. The ferrite core 116 can be, for example but not limited to, a cylinder. A height H of the cylinder can be, for example but not limited to, 12 millimeters. A first diameter D1 of the cylinder can be, for example but not limited to, 11 millimeters. The cylinder defines a center through hole 134. The conductive wire 112 is through the center through hole 134. A second diameter D2 of the center through hole 134 can be, for example but not limited to, 2.7 millimeters.

Figure 5:
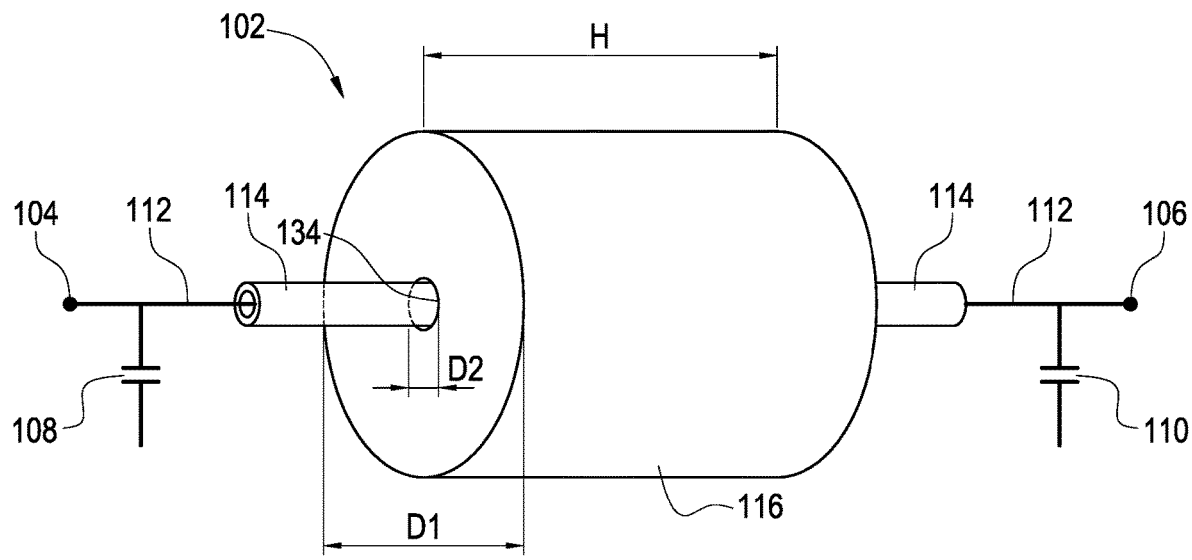
FIG. 5 shows the third embodiment of the improved choke of the present invention.

FIG. 5 shows the third embodiment of the improved choke of the present invention. The improved choke 102 comprises a conductive wire 112, and insulating sleeve 114 and a ferrite core 116. One side of the conductive wire 112 is electrically connected to the input side 104 and one side of the input capacitor 108. The other side of the conductive wire 112 is electrically connected to the output side 106 and one side of the output capacitor 110. The insulating sleeve 114 covers one part of the conductive wire 112. The ferrite core 116 covers one part of the insulating sleeve 114. The conductive wire 112 and the insulating sleeve 114 are through the ferrite core 116. The insulating sleeve 114 is arranged between the conductive wire 112 and the ferrite core 116, so that the conductive wire 112 is insulated from the ferrite core 116. The ferrite core 116 can be, for example but not limited to, a high saturation current ferrite core. A bearable current of the conductive wire 112 can be, for example but not limited to, greater than or equal to 10 amperes. When the bearable current of the conductive wire 112 is greater than or equal to 10 amperes, the ferrite core 116 still does not saturate (namely, the ferrite core 116 is in a non-saturation status). The ferrite core 116 can be, for example but not limited to, made of manganese zinc. The conductive wire 112 can be, for example but not limited to, a copper wire. The insulating sleeve 114 can be, for example but not limited to, made of plastics. The ferrite core 116 can be, for example but not limited to, a cylinder. A height H of the cylinder can be, for example but not limited to, 12 millimeters. A first diameter D1 of the cylinder can be, for example but not limited to, 11 millimeters. The cylinder defines a center through hole 134. The conductive wire 112 and the insulating sleeve 114 are through the center through hole 134. A second diameter D2 of the center through hole 134 can be, for example but not limited to, 2.7 millimeters.

Figure 6:
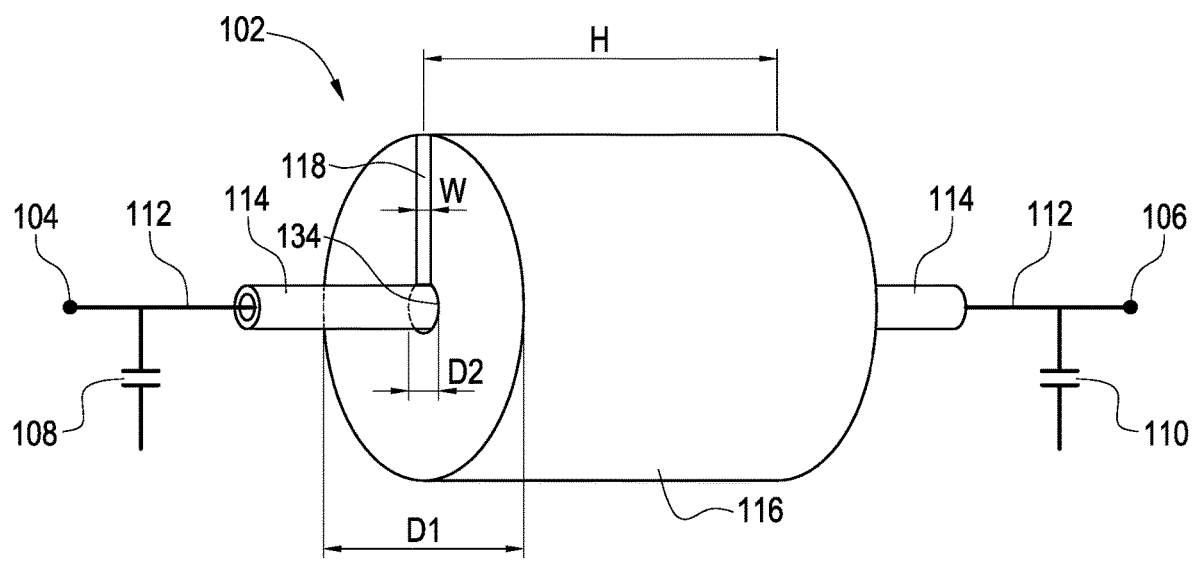
FIG. 6 shows the fourth embodiment of the improved choke of the present invention.

FIG. 6 shows the fourth embodiment of the improved choke of the present invention. The improved choke 102 comprises a conductive wire 112, and insulating sleeve 114 and a ferrite core 116. One side of the conductive wire 112 is electrically connected to the input side 104 and one side of the input capacitor 108. The other side of the conductive wire 112 is electrically connected to the output side 106 and one side of the output capacitor 110. The insulating sleeve 114 covers one part of the conductive wire 112. The ferrite core 116 covers one part of the insulating sleeve 114. The conductive wire 112 and the insulating sleeve 114 are through the ferrite core 116. The insulating sleeve 114 is arranged between the conductive wire 112 and the ferrite core 116, so that the conductive wire 112 is insulated from the ferrite core 116. The ferrite core 116 can be, for example but not limited to, a high saturation current ferrite core. The ferrite core 116 defines a gap 118 to achieve the high saturation current ferrite core. A width W of the gap 118 can be, for example but not limited to, between 0.1 millimeter and 1.0 millimeter, for example, 0.2 millimeter. A bearable current of the conductive wire 112 can be, for example but not limited to, greater than or equal to 10 amperes. When the bearable current of the conductive wire 112 is greater than or equal to 10 amperes, the ferrite core 116 still does not saturate (namely, the ferrite core 116 is in a non-saturation status). The ferrite core 116 can be, for example but not limited to, made of manganese zinc. The conductive wire 112 can be, for example but not limited to, a copper wire. The insulating sleeve 114 can be, for example but not limited to, made of plastics. The ferrite core 116 can be, for example but not limited to, a cylinder. A height H of the cylinder can be, for example but not limited to, 12 millimeters. A first diameter D1 of the cylinder can be, for example but not limited to, 11 millimeters. The cylinder defines a center through hole 134. The conductive wire 112 and the insulating sleeve 114 are through the center through hole 134. A second diameter D2 of the center through hole 134 can be, for example but not limited to, 2.7 millimeters.

The advantage of the present invention is to reduce parasitic capacitances and parasitic inductances of the choke used in the cable television apparatus to improve high frequency characteristics of the choke, and to save the cost of the winding of the choke used in the cable television apparatus. Moreover, the improved choke 102 of the present invention can be called as a non-winding electrifying choke. The improved choke 102 of the present invention can reduce the insertion loss. The gap 118 shown in FIG. 4 and FIG. 6 can be, for example but not limited to, connected to the center through hole 134; the width W of the gap 118 can be, for example but not limited to, less than the second diameter D2 of the center through hole 134; a length of the gap 118 can be, for example but not limited to, equal to the height H of the cylinder.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A cable television apparatus applied to an input coaxial cable and an output coaxial cable to transmit a cable television signal, the cable television apparatus comprising:
   an improved choke electrically connected to the input coaxial cable and the output coaxial cable;
   an input side electrically connected to one side of the improved choke and the input coaxial cable;
   an output side electrically connected to the other side of the improved choke and the output coaxial cable;
   an input capacitor, one side of the input capacitor electrically connected to one side of the improved choke and the input side; and
   an output capacitor, one side of the output capacitor electrically connected to the other side of the improved choke and the output side,
   wherein the improved choke comprises:
      a conductive wire, one side of the conductive wire electrically connected to the input side and one side of the input capacitor, the other side of the conductive wire electrically connected to the output side and one side of the output capacitor; and
      a ferrite core covering one part of the conductive wire,
   wherein the ferrite core is a high saturation current ferrite core,
   wherein the improved choke further comprises:
      an insulating sleeve covering one part of the conductive wire,
   wherein the ferrite core covers one part of the insulating sleeve; the conductive wire and the insulating sleeve are through the ferrite core; the insulating sleeve is arranged between the conductive wire and the ferrite core, so that the conductive wire is insulated from the ferrite core; the insulating sleeve is made of plastics; the ferrite core is a cylinder; a height of the cylinder is 12 millimeters; a first diameter of the cylinder is 11 millimeters; the cylinder defines a center through hole; the conductive wire and the insulating sleeve are through the center through hole; a second diameter of the center through hole is 2.7 millimeters; a width of the gap is 0.2 millimeter.

2. The cable television apparatus in claim 1, wherein the ferrite core defines a gap to achieve the high saturation current ferrite core.

3. The cable television apparatus in claim 2, wherein a width of the gap is between 0.1 millimeter and 1.0 millimeter.

4. The cable television apparatus in claim 2, wherein a bearable current of the conductive wire is greater than or equal to 10 amperes; when the bearable current of the conductive wire is greater than or equal to 10 amperes, the ferrite core still does not saturate.

5. The cable television apparatus in claim 4, wherein the ferrite core is made of manganese zinc; the conductive wire is a copper wire.

6. A cable television apparatus applied to an input coaxial cable and an output coaxial cable to transmit a cable television signal, the cable television apparatus comprising:
   an improved choke electrically connected to the input coaxial cable and the output coaxial cable;
   an input side electrically connected to one side of the improved choke and the input coaxial cable;
   an output side electrically connected to the other side of the improved choke and the output coaxial cable;
   an input capacitor, one side of the input capacitor electrically connected to one side of the improved choke and the input side;
   an output capacitor, one side of the output capacitor electrically connected to the other side of the improved choke and the output side;
   a directional coupler electrically connected to the other side of the input capacitor and the other side of the output capacitor;
   a transformer electrically connected to the directional coupler; and
   a distribution circuit electrically connected to the transformer,
   wherein the improved choke comprises:
      a conductive wire, one side of the conductive wire electrically connected to the input side and one side of the input capacitor, the other side of the conductive wire electrically connected to the output side and one side of the output capacitor; and
      a ferrite core covering one part of the conductive wire, wherein the ferrite core is a high saturation current ferrite core.

7. The cable television apparatus in claim 6, wherein the ferrite core defines a gap to achieve the high saturation current ferrite core.

8. The cable television apparatus in claim 7, wherein a width of the gap is between 0.1 millimeter and 1.0 millimeter.

9. The cable television apparatus in claim 7, wherein a bearable current of the conductive wire is greater than or equal to 10 amperes; when the bearable current of the conductive wire is greater than or equal to 10 amperes, the ferrite core still does not saturate.

10. The cable television apparatus in claim 9, wherein the ferrite core is made of manganese zinc; the conductive wire is a copper wire.

* * * * *